US006539318B2

(12) United States Patent
Miller et al.

(10) Patent No.: US 6,539,318 B2
(45) Date of Patent: Mar. 25, 2003

(54) STREAMING ARCHITECTURE FOR WAVEFORM PROCESSING

(75) Inventors: Martin Thomas Miller, Avusy (CH); Jonathan Calvin Libby, Gray, ME (US); Gilles Ritter, Ollon (CH)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 09/988,120

(22) Filed: Nov. 16, 2001

(65) Prior Publication Data

US 2002/0109496 A1 Aug. 15, 2002

Related U.S. Application Data

(60) Provisional application No. 60/249,482, filed on Nov. 17, 2000.

(51) Int. Cl.[7] .................................... G01R 13/00
(52) U.S. Cl. .................................... 702/66; 324/121 R
(58) Field of Search .................................... 702/66, 67, 70, 702/77, 68, 117, 58, 125; 324/76.19, 47, 121 R

(56) References Cited

U.S. PATENT DOCUMENTS 4,634,970 A * 1/1987 Payne et al. ............ 324/121 R
4,818,932 A * 4/1989 Odenheimer ............ 324/121 R
4,906,916 A * 3/1990 Koslar .................... 324/121 R

* cited by examiner

*Primary Examiner*—Marc S. Hoff
*Assistant Examiner*—Mohamed Charioui
(74) *Attorney, Agent, or Firm*—Frommer Lawrence & Haug LLP; William S. Frommer; Gordon Kessler

(57) ABSTRACT

An oscilloscope apparatus and method of processing waveform data using a streaming architecture. The apparatus has multiple processing objects (processors) that share a common cache memory in which the waveform data is stored during processing. Each processing object performs a sequential processing operation by retrieving a "chunk" or portion of the waveform from the memory, processes the chunk of data, and re-stores the processed data into the same location in the cache memory. This process is generally repeated until the entire waveform has been sequentially processed. The apparatus operates using a "pull" design wherein the last processor requests the next chunk to be processed from the preceding processor. In this manner, the waveform data is essentially processed by pulling it through the sequence of processing objects. The multiple processing objects may be implemented as a sequence of software processing objects in a processing thread or as separate hardware processors.

17 Claims, 6 Drawing Sheets user interface
100
control variables
110
processing
120
acq. HW
130
acq. control readout
140
results objects
150
graphic rendering
180
display monitor
190
import export
160
external system
170

A chain of three non-streaming (classical) processors

A chain of three streaming processors

STREAMING ARCHITECTURE FOR WAVEFORM PROCESSING

This application claims the benefit of Provisional U.S. patent application Ser. No. 60/249,482, filed Nov. 17, 2000, the entire contents thereof being incorporated herein by reference.

BACKGROUND OF THE INVENTION

The present invention relates generally to a method and apparatus for processing waveform data acquired by an oscilloscope using a streaming architecture.

It is often desirable to perform complex processing on data obtained by a storage oscilloscope. Generally, this data is in the form of a waveform acquired by the oscilloscope's acquisition system. There are many applications in science and industry that are addressed by performing multiple operations on a waveform, thereby producing either other 'processed' waveforms or sets of parametric values. Traditionally, such multiple operation processing is performed by repeatedly processing the entire waveform using a single processor.

However, this approach has several drawbacks. First, the repeated use of a single processor means each operation must be performed sequentially and thus limits the processing speed. Speed is important because often the oscilloscope cannot acquire a next waveform until the processing of the previously acquired waveform is complete. In addition, the operator may not know what additional data needs to be acquired until processing of the previously acquired waveform is complete. Second, the entire waveform is generally processed in each operation resulting in an intermediate result. This intermediate result is often of the same size as the original waveform and therefore requires similar storage capacity. Third, each time the waveform or an intermediate result is processed, a memory retrieval/storage operation is required. Such repeated memory accesses take time and further limit the processing speed. In addition, large waveforms and their correspondingly large intermediate results often require memory areas which are beyond the processor's on-chip capacity.

Therefore, a need exists for a capability to perform multiple processing operations on large waveforms and at a relatively high speed. Preferably, a solution to this problem should be cost effective and readily implementable.

SUMMARY OF THE INVENTION

Recent advancements in operating systems that support the use of multiple processors, multiple processing objects on a single processor (i.e. virtual processors), single and plural processing threads, and shared memory caching in accordance with the invention now allow for practical implementation of a streaming architecture in digital oscilloscopes. Further, the practicality of such an approach has been proven by related developments in the processing of streaming video data.

It is therefore an object of the present invention to provide a method and apparatus for processing waveform data acquired by an oscilloscope using a streaming architecture.

Other objects and advantages of the invention will in part be obvious and will in part be apparent from the specification and the drawings.

The preferred embodiment of the invention provides an oscilloscope apparatus for processing waveform data using a streaming architecture. The oscilloscope apparatus has a waveform source for supplying the waveform data, a plurality of processing objects for sequentially processing portions of the waveform data, and an outlet means for requesting portions of the waveform data from the plurality of processing objects. The processing objects have a processing memory for storing portions of the waveform during processing and which is accessible by each of the plurality of processing objects. A first processing object retrieves a portion of the waveform data from the waveform source in response to a request by a second processing object, processes the portion of the waveform data and stores the processed portion in a memory location designated as corresponding to the requested portion. A second processing object requests the portion of the waveform data from the first processing object, retrieves the portion processed by the first processing object from the memory location in response to a request by the outlet means, further processes the processed portion, and stores the processed portion back in the memory location corresponding to the requested portion. The outlet means then retrieves the portion processed by the second processing object from the memory location corresponding to the requested portion.

In the preferred embodiment, the processing memory may be a cache memory. The waveform source generally has a separate memory for storing the waveform data. The outlet means is usually a display for displaying the processed waveform and may have a memory for storing the processed waveform data.

Another aspect of the invention is that the outlet means may request further portions of the waveform data from the second processor after retrieving the processed portion of the waveform data from the memory location, until the entire waveform data has been requested and processed.

Another aspect of the invention is that the outlet means may request further portions of the waveform data from the second processing object after retrieving the processed portion of the waveform data from the memory location, such that the plurality of processing objects simultaneously process sequentially requested portions of the waveform data using corresponding memory locations.

Another aspect of the invention is that the plurality of processing objects further comprises a third processing object for requesting the portion of the waveform data from the second processing object and retrieving the portion processed by the second processing object from the memory location corresponding to the requested portion in response to a request by the outlet means. The third processing object further processes the processed portion and stores the processed portion back in the memory location. The outlet means retrieves the portion processed by the third processing object from the memory location corresponding to the requested portion.

Another aspect of the invention is that the plurality of processing objects further comprises plural sequential processing objects. A first sequential processing object requests the portion of the waveform data from the second processing object. The plural sequential processing object other than the first sequential processing object request the portion of the waveform data from a preceding sequential processing object. A last sequential processing object retrieves the processed portion from the memory location in response to a request by the outlet means. The plural sequential processing objects other than the last sequential processing object retrieve the processed portion from the memory location in response to a request by a next sequential processing object. The plural sequential processing objects further process the processed portion and store the processed portion back in the memory location. The outlet means retrieves the portion processed by the last sequential processing object from the memory location.

Another aspect of the invention is that the oscilloscope apparatus may further comprise acquisition means for acquiring the waveform data for the waveform source.

Another aspect of the invention is that the oscilloscope apparatus may further comprise a user interface for programming the processing performed by the plurality of processing objects.

Another aspect of the invention is that the oscilloscope apparatus may be interrupted between processing the portions of the waveform data.

A second embodiment of the invention provides a method of processing waveform data using a streaming architecture. The method first requests a portion of the waveform data for processing. The requested portion of the waveform data is retrieved using the first of a plurality of sequential processing objects. The retrieved portion of the waveform data is processed with the first processing object to obtain a processed portion which is stored in a memory location designated as corresponding to the retrieved portion. The processed portion is then retrieved from the memory location using the next of the plurality of sequential processing objects. The processed portion is then further processed with the next processing object and stored back in the memory location corresponding to the retrieved portion. The retrieval and processing steps are repeated for each of the plurality of sequential processing objects. The processed portion of the waveform data is retrieved from the memory location corresponding to the retrieved portion. Each of the above steps are repeated for different portions of the waveform data until the entirety of the waveform data is processed.

In the second embodiment, The memory location may reside in a cache memory shared by the plurality of sequential processing objects. In addition, the processing steps may be performed simultaneously for different portions of the waveform data using memory locations corresponding to the respective portions.

Another aspect of the invention is that the method may further comprise a step of acquiring the waveform data.

Another aspect of the invention is that the method may further comprise a step of programming the processing performed by the plurality of processing objects.

Another aspect of the invention is that the method may further comprise a step of displaying the processed waveform.

Another aspect of the invention is that the method may be interrupted between processing the portions of the waveform data.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The preferred embodiments of the apparatus and method according to the present invention will be described with reference to the accompanying drawings.

Figure 1:
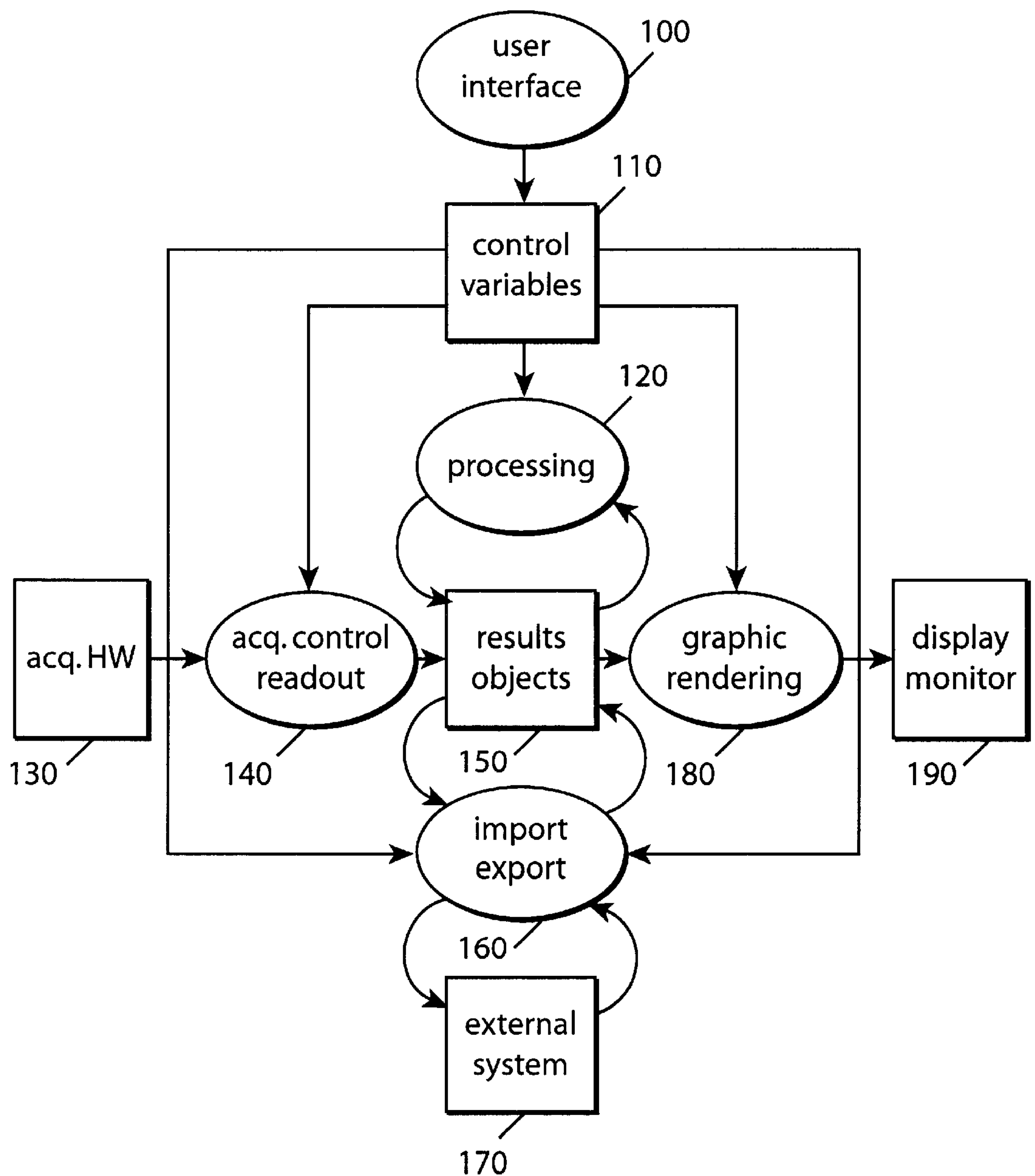
FIG. 1 is a system diagram showing the functional connections in a related art oscilloscope.
Figure 2:
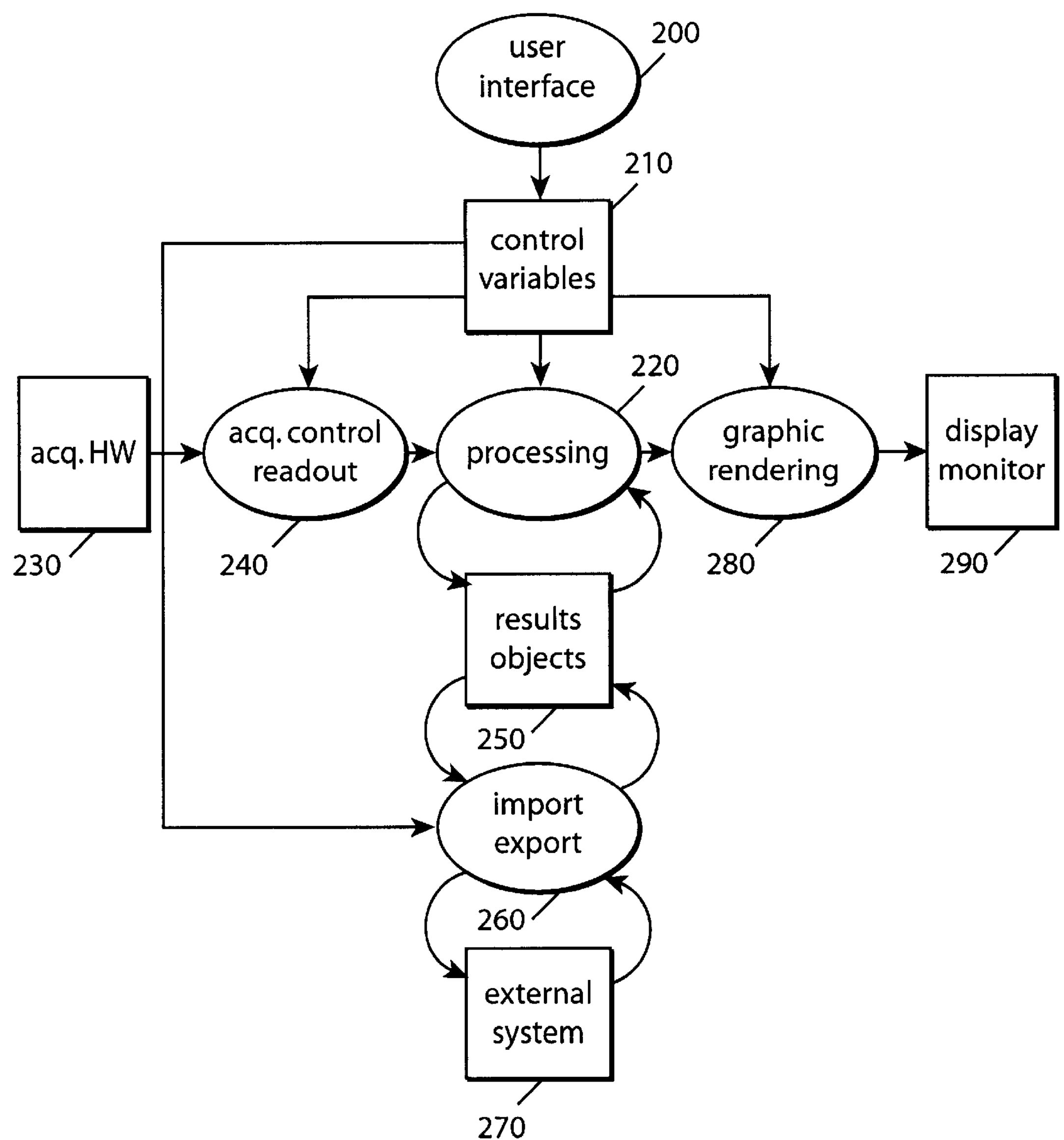
FIG. 2 is a system diagram showing the functional connections in an oscilloscope according to the present invention.

A comparison of FIG. 1 to FIG. 2 illustrates the differences between a related art (classical) oscilloscope and a streaming architecture oscilloscope, respectively. FIG. 1 is a system diagram showing the functional connections in the related art oscilloscope. Oscilloscopes, as shown in FIG. 1, typically have a user interface 100 for inputting/setting various control variables 110 for controlling the operations performed by the oscilloscope. Acquisition hardware 130 is used to acquire waveform data in accordance with the setting of an acquisition control/readout 140. The waveform data is stored in a results memory 150. Often this waveform data is transferred/stored via an import/export means 160 to an external system 170, such as a hard drive. Each processing operation is performed by processing object (alternately referred to hereinafter as a processor) 120 under the control of the control variables 110. In performing each processing step, the processing object accesses the entire waveform data stored in the results memory 150 and then re-stores the processed results including any intermediate results back in the results memory 150. Thus, the processing object 120 must repeatedly access the results memory 150. When processing is complete the graphic/rendering unit 180 accesses the processed waveform data from the results memory 150 and displays it on the display monitor 190.

Whereas, FIG. 2 is a system diagram showing the functional connections in a streaming architecture oscilloscope according to the present invention. While the architecture shown in FIG. 2 contains functional components that are similar to those in FIG. 1, the central focus is shifted from the results memory 150 to the processing object 220. Note that processing object 220 may be implemented as a plurality of hardware processors either in series (sequential) or in parallel, or alternately as multiple virtual processing objects (in a thread) designated by the operational software. In the streaming architecture of FIG. 2, the waveform data is transferred directly from the acquisition control/readout 240 to the processing object 220. During processing the waveform data and any intermediate results are kept within cache memory resident within the processing object 220, at least to the extent practical. If the waveform data is too large to fit entirely within the cache memory then the data is stored in results memory 250 and portions (or chunks) are loaded into the cache and processed as practical. Reducing the number of times the results memory 250 is accessed makes this approach significantly more efficient than the approach employed in related art oscilloscopes (as in FIG. 1).

A far greater processing flexibility is obtained by being able to use multiple processing objects. Multiple processing objects can be interconnected to perform a chain of processing functions. Such chaining of processing objects to perform complex processing was pioneered by LeCroy Corporation in their model 7200 precision digital oscilloscope.

Figure 3:
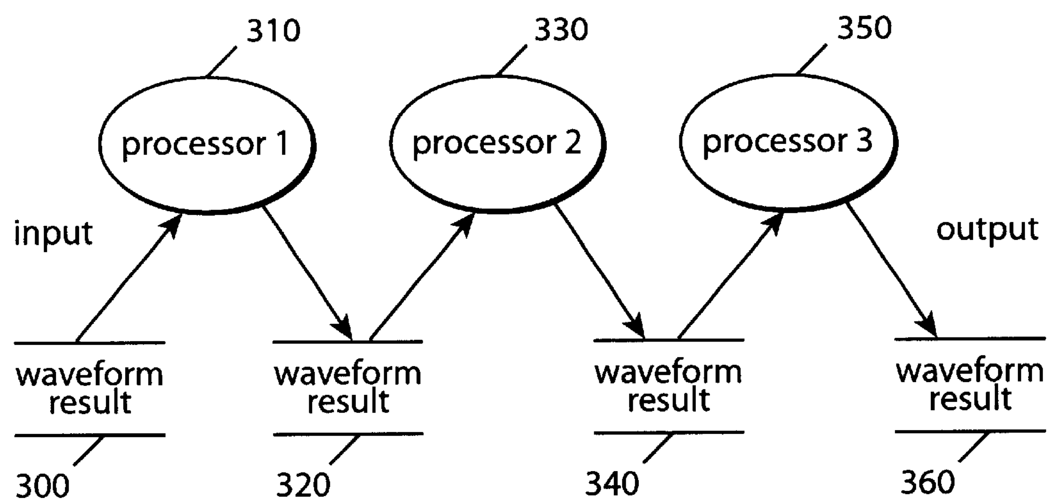
FIG. 3 is a block diagram showing processing of a waveform by three non-streaming chained processing objects.

Initially, implementations using multiple processing objects used each processor to operate on the entire waveform thereby producing an entire waveform result. FIG. 3 shows an exemplary implementation for a related art (classic) oscilloscope having three non-steaming chained processing objects. First, processor 1 (310) retrieves and processes the "input" waveform result 300 (usually a raw digitized waveform) from a memory (not shown) and produces an entire processed waveform result 320 which is stored back in memory. After processor 1 finishes, processor 2 (330) retrieves and processes that second waveform result 320, thereby producing a third waveform result 340 which is also stored back in memory. Finally processor 3 (350) retrieves and processes waveform result 340 producing another entire waveform result 360 as the overall output of the chained processing objects. Two important aspects of this process are: 1) that each processing object completes its processing before the next processing object in the chain begins processing, and 2) the entire waveform is processed at each step which results in several intermediate (and otherwise unused) waveforms which consume the host computer's resources (memory).

As the sampling/storage rate of digital oscilloscopes and digitizers have become faster, and as the signals/waveforms of interest have become more complex (e.g. telecommunications signals), the amount of data being collected has increased accordingly. This increase in data poses two problems to instrumentation which performs analysis or processing on the aforementioned waveforms. The first is that significantly more computer memory is required to store the results. This problem is compounded by an increase in the complexity of the desired processing which result in multiple intermediate waveform results. The second problem is that this increased data leads to a corresponding increase in the time required to process the data. The following table illustrates the evolution of this situation since the mid-1980s with respect to LeCroy oscilloscopes:

| Year | LeCroy Oscilloscope | Sampling Speed | Memory (samples) |
|---|---|---|---|
| 1984 | Model 9400 DSO | 100 MS/s | up to 32 k |
| 1987 | Model 9450 | 400 MS/s | up to 256 k |
| 1988 | Model 7200 DSO | 1 GS/s | up to 1 M |
| 1993 | Model 9300 DSO | 100 MS/s | up to 4 M |
| 1995 | Model 9350 DSO | 500 MS/s | up to 4 M |
| 1997 | Model 9384 | 1 GS/s | up to 8 M |
| 1998 | Model LC584 | 4 GS/s | up to 16 M |
| 2000 | Model WP960 | 16 GS/s | up to 32 M |

As shown in the table, the amount of data collectible by digital oscilloscopes has increased a thousand fold over the last 15 years. There is reason to believe this trend will continue. Hence, there is clearly a significant problem in how to efficiently process the data using a waveform processor's memory resources. Any solutions to this problem impact how much data and how quickly a user can obtain a processing result. Moreover, the total complexity of the processing is limited by the host computer's resource limits.

There is a two-fold aspect to the increased data/processing problem mentioned above. To process the data efficiently in terms of time and to process efficiently in terms of the available memory resources. An important aspect of the present invention is based on an understanding of the nature of modem computer architecture, and the subject of memory caching and memory management.

Modern computing devices (which perform the processing with which we are concerned) have multiple levels of memory caching. The speed (or time efficiency) of access to data which is cached is highest for what is usually called 1 st level (or primary) cache. The time to access a 32-bit word of information from primary cache is often as short as a single processor clock cycle (which currently may be around a nanosecond). A 2nd level (or secondary) cache is somewhat slower with access times being often as slow as 2 or 3 clock cycles. These times compare very favorably to an uncached memory access, which is limited by memory and bus speeds for a given architecture. Hence, uncached memory access times are often a factor of 10 times (or more) longer than access to a primary cache.

Note that there is a penalty for having to load data into cache memories from regular memory. When a "cache-miss" event (memory access to an address which is not cached) occurs, a block of data is loaded into a "cache-line." In many present-day architectures, this block size is rarely smaller than 32 bytes. This significantly slows the processing time. The number of such cache-miss events, requiring memory access, can be minimized by limiting the processing operations to local blocks of data (i.e. data stored in close address locations). In this manner, the penalty for loading the cache can be minimized and full benefit can be made of the speed advantage gained by processing from cache memory.

However, the amount of available cache memory (both primary and secondary) is usually limited. So one consequence of the chained processor architecture described in FIG. 3, is that for each process an entire waveform is created. In such a case it is likely the result requires a larger address space than can be cached, and consequently all of the cache is "flushed" (full). As will be explained in accordance with the invention, by not producing entire waveforms as intermediate results, and by "re-using" the same (limited or small) memory space for storing parts of the intermediate results, an enormous gain in efficiency (speed) of memory access is achieved. As an additional benefit, large amounts of memory (a prime system resource) are not wasted.

Furthermore, the streaming architecture is made possible, at least in part, by the use of encapsulation (or data hiding) software design techniques. In previous oscilloscope processing designs, the full data buffers are made publicly available for consumption by any and all client software objects that wish to access the data of any processing object. Because all client software objects know the location and size of these buffers, the buffers must be completely updated with the correct size and all data values before any subsequent processing can be performed. In other words, the data is not encapsulated (not hidden) in these previous designs.

In the streaming architecture design of the present invention (as discussed hereinafter), there are no publicly available processing data buffers. Instead all data is encapsulated (hidden), such that client software objects may only access data via query operations. The particular processor then responds to the query by copying the requested data into the client's buffer (i.e. cache memory), which is also specified as part of the query operation. For a streaming processor, the query is typically implemented by querying the processor attached to its input and performing some calculation on that data before returning it to the client. Other types of processors (non-streaming) may need to keep data buffers, but even in those cases, the data is encapsulated, and therefore, other optimization techniques may be utilized. In summary, the use of encapsulation makes it possible to implement different data management strategies, which are appropriate for the various types of processors. Without encapsulation of this data, this level of flexibility is not possible.

Figure 4:
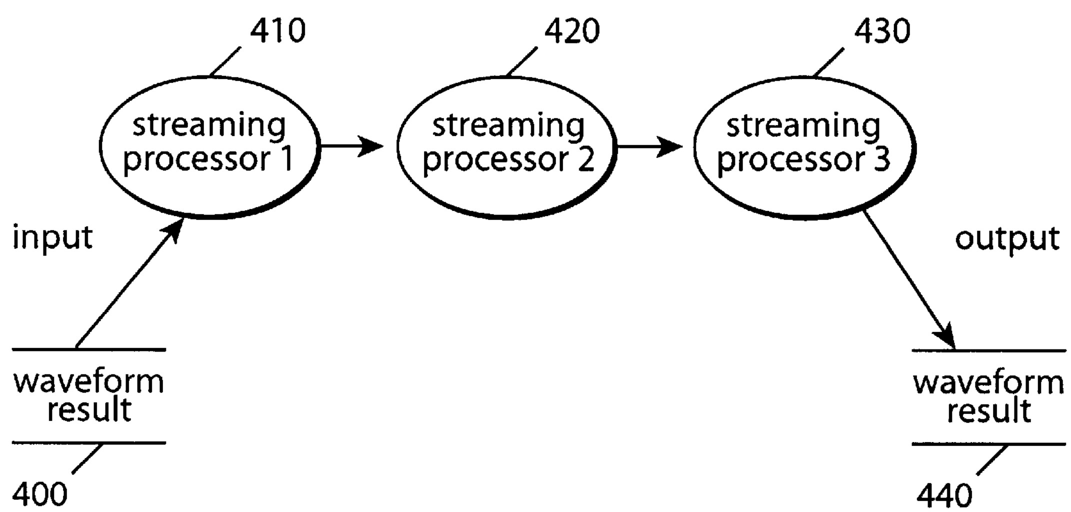
FIG. 4 is a block diagram showing processing of a waveform by three streaming processing objects according to the present invention.

Referring now to FIG. 4, the essence of the streaming architecture is explained. The sequence of events is from output to input. This is sometimes referred to as a "pull" system, rather than the "push" system such as in the classical chained processing architecture described before. First the processing object 3 (430), requests a "chunk" of data from processing object 2 (420) for the purpose of constructing the output waveform result (440). Note, that processing object 3 provides the cache memory buffer for processing the data. Processing object 2 has no data yet, and so in-turn requests the data from processor 1 (410). Processing object 2 can then process the data received from processor 1 and pass the result on to processing object 3. Additionally, processing object 2 uses the same cache memory buffer as processing object 3. Processing object 1 has no data yet either, and so requests from the input waveform result 400 sufficient data to fill the cache buffer provided by processing object 3. The amount of data in the original request by processing object 3 is variable, but is typically 32 or 64 samples of data (so as to align to the host computers cache-line boundaries).

Processing object 1 operates in-place on this requested "chunk" of data samples, producing an equal sized chunk in the same cache buffer. All of the memory accesses to that buffer are "cache hits" so the access is very rapid. Then processing object 2 receives the data it requested (i.e. the data processed by processor 1), and operates upon it, also in-place, and also benefiting from cache hits thereby producing the data requested by processing object 3. Processing object 3 now has the processed data it originally requested in the buffer it provided. Processing object 3 operates upon the data, thereby producing a result which is output as the final waveform result 440. This sequence is repeated on "chunks" of the waveform data until the entirety of the waveform data is processed.

Note that certain kinds of processing do not produce 1-for-1 results (input samples to output samples). For these a slightly different approach is taken, but basically with a similar strategy. In these instances the data is processed in small portions which for the most part remain in primary cache of the hosting computer. Other kinds of processes cannot be streamed, such as signal averaging and "roof and floor" processing. These processes require the entire waveform to be processed at once. However, in the presence of many other processing elements, these processes can still benefit from the streaming architecture. By maximizing use of the cache memory and providing results in the fashion described, the overall design achieves a high level of efficiency using only a minimum of conventional memory resources.

An additional benefit from processing the data in chunks, is that the processing can be aborted, paused, or initiated in the middle of a waveform. This is a significant advantage over prior art systems that must wait until the entire waveform is processed before the system can be interrupted. This advantage is especially apparent when large waveforms are processed using complex algorithms which can take tens of seconds or even minutes to complete.

This "pull" approach, whereby the data is pulled rather than pushed through the system, means the processing objects are only waiting for data they have requested. A problem with the push approach is that the processors are idle for long periods of time waiting in a loop for data to arrive. To a great extent, the pull approach alleviates this problem since the processors only wait in response to a request for data that they have sent.

Figure 5:
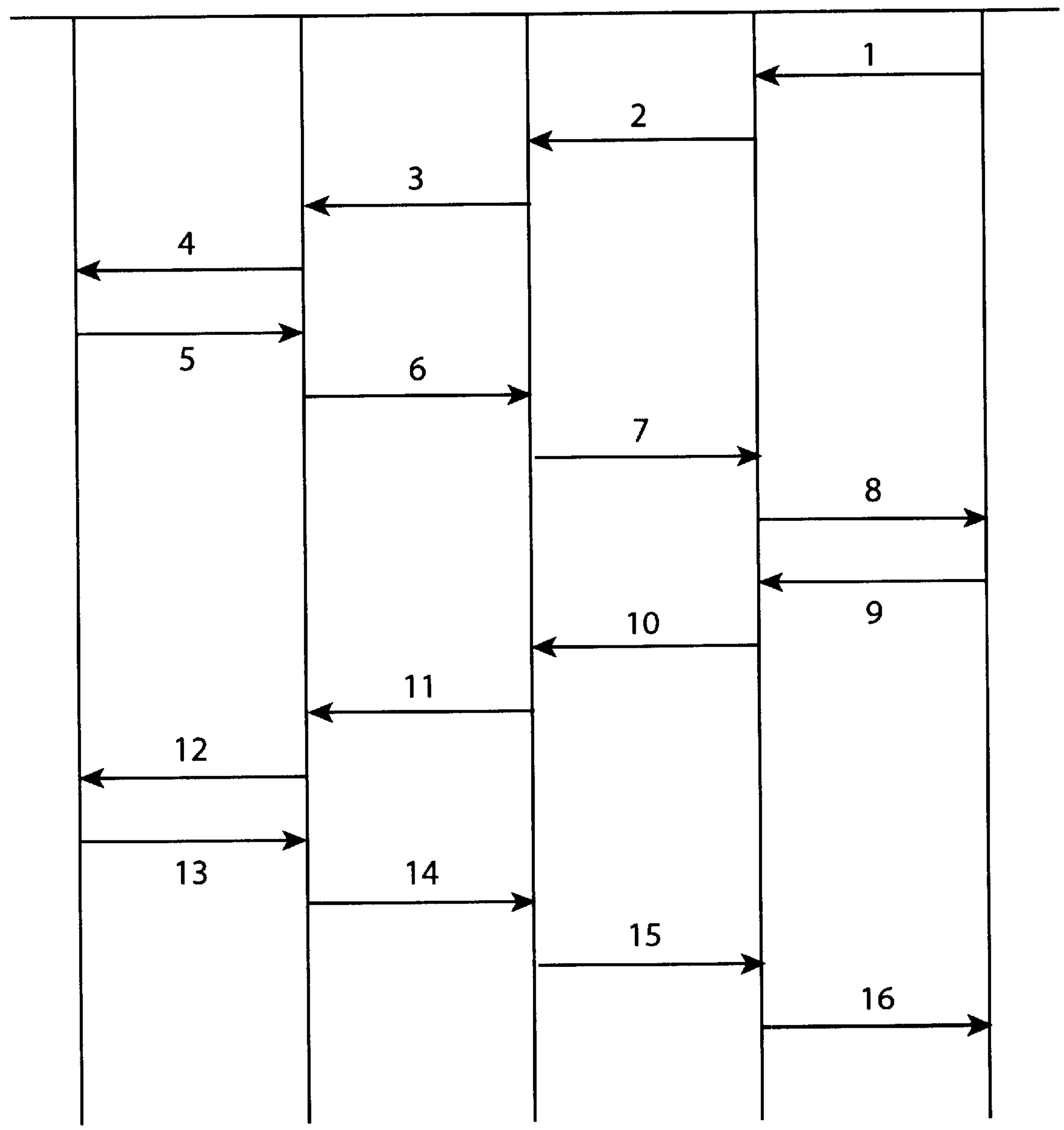
FIG. 5 is a chart illustrating the steps in processing a waveform by the three processing objects according to the present invention shown in FIG. 4.

FIG. 5 is a chart illustrating the steps in processing a waveform by the three processing objects according to the present invention as shown in FIG. 4. Step 1 is output waveform result (540) requesting a "chunk" of data from its source, processing object 3 (530). In Step 2, processing object 3 requests sufficient data from its source, processing object 2 (520), to fulfill the request from the output waveform result. Processing object 2 then requests sufficient data from its source, processing object 1 (510), to fulfill the request from processing object 3. (Step 3) In turn, processing object 1 requests sufficient data from its source, input waveform result (500) to fulfill the request from processing object 2. (Step 4) The waveform source supplies the requested data "chunk" to processing object 1. (Step 5) Processing object 1 processes the chunk of data (typically in the cache) and supplies it to processing object 2. (Step 6) Processing object 2 processes the chunk of data (typically in the cache) and supplies it to processing object 3. (Step 7) Processing object 3 processes the chunk of data (typically in the cache) and supplies it to the output waveform sink. (Step 8) The output waveform result then requests another "chunk" of data from its source, processing object 3. (Step 9) This process is repeated (Steps 9–16) until all waveform data is processed.

Figure 6:
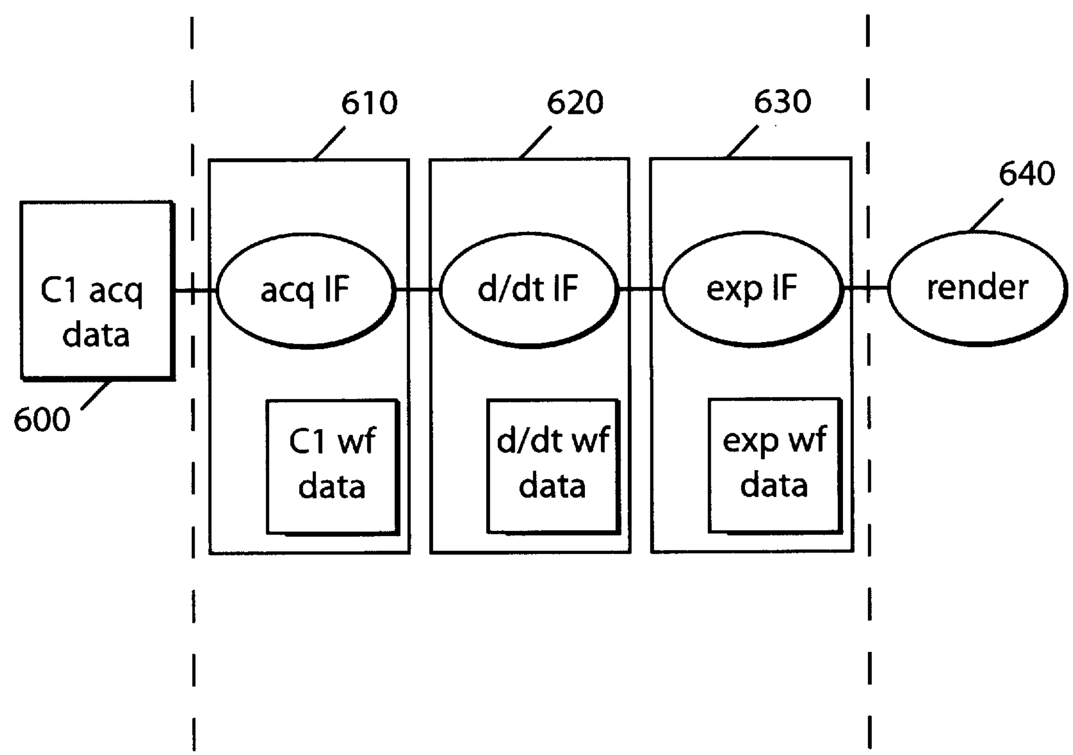
FIG. 6 is a block diagram showing an example of waveform processing for comparing the streaming and non-streaming approaches.

FIG. 6 is a block diagram showing an example of waveform processing for comparing the streaming and non-streaming approaches. FIG. 6 shows a complex multi-step process that acquires and processes a waveform C1 to produce the output waveform, exp(dC1/dt). In the related art non-streaming system, such as that described in FIG. 3, an acquisition interface 610 is used to acquire the waveform C1 600. Next, the waveform is processed by taking the derivative of C1 as a function of time, dC1/dt, 620. This intermediate derivative result is then processed by the exponential function 630 to produce the "exp wf data." The processed result is then rendered (displayed) 640.

By contrast, the streaming architecture of the present invention starts with the rendering function 640 requesting a portion of the waveform. The exponential interface 630 receives the request and determines that it needs the data from the derivative interface 620. In turn, the derivative interface requests the data from the acquisition interface 610. The acquisition interface then acquires the data for the c1 waveform source 600. The acquired data is sent to the derivative interface and processed. The processed data is sent to the exponential interface, processed and then sent to the renderer. Generally, the renderer stores the data in a buffer and requests the next portion of the waveform. When the entire waveform C1 has been processed, the processed data is displayed.

While it seems as though there are more steps in the streaming architecture approach, by processing the waveform in chunks which fit into cache memory this approach can be greater than ten times more efficient than the non-streaming approach. In addition, the memory requirements are significantly reduced since intermediate results do not need to be stored in normal memory.

Although in the above-described figures the processing objects are shown as distinct elements, the present invention is not so limited. Alternatively, the processing objects may be virtual processors in a single thread created by multi-tasked operation of a single processor. As an example, the three processing objects shown in FIGS. 3 and 4 may correspond to three distinct processing operations which are performed using a single processor.

Furthermore, the processing operations may be performed either serially or simultaneously. This may be done by setting up plural processing threads to process the data. In this manner, different portions of the waveform data can be processed simultaneously using cache memory locations designated as corresponding to the respective portions.

The functionality of the present invention's streaming architecture, as described herein, is applicable to the processing web described in Provisional U.S. Patent Application No. 60/249,482, filed Nov. 17, 2000, the entire contents thereof being incorporated herein by reference. The processing web provides an oscilloscope design that is completely "modular," whereby the elements comprising the oscilloscope are completely specified in terms of interface, and are sufficiently independent in construction that they can be installed and removed at run-time (e.g. without stopping the process which can be considered the oscilloscope application software). Basically, there is no limit to the permitted complexity of a given "processing web."

The processing web supports the use of multiple processing objects which may be chained together, utilizing multiple inputs and producing multiple outputs. Processors may be used to produce data for more than one further processor. Each processing object receives certain inputs (according to various input requirements) and generates particular output types (e.g. parameters, persistence maps or waveforms). These processing objects also have particular update or synchronization characteristics for obtaining or generating information, and can be expressed using a same generic processor model, but being designated according to a variable number and type of input, output and update pins.

Thus, the present invention's streaming architecture approach can be implemented using the processing web's multiple processing object capability to perform complex multi-step processing operations using chained processors. There is virtually no limit to the complexity or configuration of processing objects that may be implemented in the processing web system.

While a preferred embodiment of the present invention has been described using specific terms, such description is for illustrative purposes only, and it is to be understood that changes and variations may be made without departing from the spirit or scope of the following claims.

What is claimed is:

1. An oscilloscope apparatus for processing waveform data using a streaming architecture, comprising:

a waveform source for supplying said waveform data;

a plurality of processing objects for sequentially processing portions of said waveform data, comprising at least:

a processing memory for storing portions of said waveform during processing and accessible by each of said plurality of processing objects;

a first processing object for retrieving a portion of said waveform data from said waveform source in response to a request by a second processing object, processing said portion of said waveform data and storing the processed portion in a memory location designated as corresponding to the requested portion; and said second processing object requesting said portion of said waveform data from said first processing object and retrieving the portion processed by said first processing object from said memory location in response to a request by an outlet means, further processing the processed portion, and storing the processed portion back in said memory location; and said outlet means requesting said portion of said waveform data from said second processing object and retrieving the portion processed by said second processing object from said memory location said outlet means requesting further portions of said waveform data from said second processing object after retrieving the processed portion of said waveform data from said memory location until the entire waveform data has been requested and processed.

2. The oscilloscope apparatus according to claim 1, wherein said outlet means requests further portions of said waveform data from said second processor after retrieving said processed portion of said waveform data from said memory location, such that said plurality of processing objects simultaneously process sequentially requested portions of said waveform data using corresponding memory locations.

3. The oscilloscope apparatus according to claim 1, wherein said plurality of processing objects further comprises a third processing object for requesting said portion of said waveform data from said second processing object and retrieving the portion processed by said second processing object from said memory location corresponding to the requested portion in response to a request by said outlet means, further processing the processed portion, and storing the processed portion back in said memory location; and said outlet means retrieving the portion processed by said third processing object from said memory location corresponding to the requested portion.

4. The oscilloscope apparatus according to claim 1, wherein said processing memory is a cache memory.

5. The oscilloscope apparatus according to claim 1, wherein said waveform source has a memory for storing said waveform data.

6. The oscilloscope apparatus according to claim 1, further comprising acquisition means for acquiring said waveform data for said waveform source.

7. The oscilloscope apparatus according to claim 1, further comprising a user interface for defining the processing performed by said plurality of processing objects.

8. The oscilloscope apparatus according to claim 1, wherein said outlet means is a display for displaying the processed waveform.

9. The oscilloscope apparatus according to claim 1, wherein the processing of said waveform data can be interrupted between portions of said waveform.

10. A method of processing waveform data using a streaming architecture, comprising the steps of:

a) requesting a portion of said waveform data for processing;

b) retrieving said portion of said waveform data using the first of a plurality of sequential processing objects;

c) processing the retrieved portion of said waveform data with the first processing object to obtain a processed portion;

d) storing said processed portion in a memory location designated as corresponding to the retrieved portion;

e) retrieving the processed portion from said memory location using the next of said plurality of sequential processing objects;

f) processing the processed portion with the next processing object;

g) storing the processed portion back in said memory location corresponding to the retrieved portion;

h) repeating steps e) through g) for each of said plurality of sequential processing objects;

i) retrieving the processed portion of said waveform data from said designated memory location corresponding to the retrieved portion; and j) repeating steps a) through i) for different portions of said waveform data until the entirety of the waveform data is processed.

11. The method according to claim 10, wherein processing steps c) and f) are performed simultaneously for different portions of said waveform data using memory locations designated as corresponding to the respective portions.

12. The method according to claim 10, wherein said memory location resides in a cache memory shared by said plurality of sequential processing objects.

13. The method according to claim 10, further comprising the step of acquiring said waveform data.

14. The method according to claim 10, further comprising the step of programming the processing performed by said plurality of processing objects.

15. The method according to claim 10, further comprising a step of displaying the processed waveform.

16. The method according to claim 10, wherein the method can be interrupted between processing the portions of said waveform data.

17. An oscilloscope apparatus for processing waveform data using a streaming architecture, comprising:

a waveform source for supplying said waveform data;

a processing memory for storing portions of said waveform during processing;

a plurality of sequential processing objects for sequentially processing portions of said waveform data; a first of said plurality of sequential processing objects requesting, retrieving, and processing a portion of said waveform data from said waveform source in response to a request by a next one of said plurality of sequential processing objects, and storing the processed portion in a memory location of said processing memory designated as corresponding to the requested portion; the plurality of sequential processing objects other than the first sequential processing object and a last of said plurality of sequential processing objects requesting, retrieving, and processing said portion of said waveform data from a preceding one of said plurality of sequential processing objects in response to a request by the next sequential processing object, and storing the processed portion back in said memory location; the last sequential processing object requesting, retrieving, and processing said portion of said waveform data from the preceding sequential processing object in response to a request by an outlet means, and storing the processed portion back in said memory location; and said outlet means requesting said portion of said waveform data from the last sequential processing object and retrieving the portion processed by the last sequential processing object from said memory location.

* * * * *